(12) United States Patent
Byun et al.

(10) Patent No.: US 7,485,556 B2
(45) Date of Patent: Feb. 3, 2009

(54) FORMING METAL SILICIDE ON SILICON-CONTAINING FEATURES OF A SUBSTRATE

(75) Inventors: Jeong Soo Byun, Cupertino, CA (US); Jianxin Lei, Santa Clara, CA (US); Lisa Yang, Saratoga, CA (US); Hien-Minh Huu Le, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 11/084,450

(22) Filed: Mar. 18, 2005

(65) Prior Publication Data
US 2006/0211202 A1 Sep. 21, 2006

(51) Int. Cl.
*H01L 21/28* (2006.01)
(52) U.S. Cl. ............................. 438/583; 438/584
(58) Field of Classification Search ........... 438/581, 438/582, 583, 648, 649, 650, 651, 655, 664, 438/682, 683, 584; 257/E29.161
See application file for complete search history.

(56) References Cited

U.S. PATENT DOCUMENTS

| 6,579,783 | B2 | 6/2003 | Saigal et al. | |
|---|---|---|---|---|
| 6,605,513 | B2 * | 8/2003 | Paton et al. | 438/299 |
| 2006/0024963 | A1 * | 2/2006 | Yue et al. | 438/664 |
| 2006/0130746 | A1 * | 6/2006 | Terashima et al. | 117/95 |
| 2006/0175664 | A1 * | 8/2006 | Ramaswamy et al. | 257/384 |

FOREIGN PATENT DOCUMENTS
WO    WO 2004042809 A1    5/2004

OTHER PUBLICATIONS

Tice et al.; "Endura XP: Enabling High Productivity and Reliability . . . " Applied Materials, Inc., date unknown.
Byun et al.; "Thermally Stable Nickel Silicide Formation by . . . " Applied Materils, Inc., date unknown.
Lavoie et al; "Towards Implementation of a nickel silicide process . . . " Microelectronic Engineering 70 (2003) 144-157.
Lauwers et al.; "Materials aspects, electrical performance, and a . . . " J. Vac. Sci. Technol. B 16(6) Nov./Dev 2001.
Lu et al.; "A Novel Nickel SALICIDE Process Technology . . . " Silicon Technology Development Instruments, date unknown.

* cited by examiner

*Primary Examiner*—Thao P. Le
(74) *Attorney, Agent, or Firm*—Janah & Associates, P.C.

(57) ABSTRACT

A metal silicide layer is formed on silicon-containing features of a substrate in a chamber. A metal film is sputter deposited on the substrate and a portion of the sputter deposited metal film is silicided. In the process, sputtering gas is energized by applying an electrical bias potential across the metal sputtering target and the substrate support to sputter deposit metal from a target onto the substrate. At least a portion of the deposited sputtered metal is silicided by heating the substrate to a silicidation temperature exceeding about 200° C. to form a combined sputtered metal and metal silicide layer on the substrate. The remaining sputtered metal can be silicided by maintaining the substrate at the silicidation temperature to form the metal silicide layer.

28 Claims, 7 Drawing Sheets

FORMING METAL SILICIDE ON SILICON-CONTAINING FEATURES OF A SUBSTRATE

BACKGROUND

Embodiments of the present invention relate to forming metal silicide on silicon-containing features of a substrate.

Low resistivity metal silicide regions are formed on semiconductor features to enable electrical interconnection of components of a semiconductor device. Self-aligned suicides (referred to as "salicides") are formed on silicon-containing features, such as gates, to provide a layer of low resistivity material on the feature. In the self-aligned silicide processing method, a metal is deposited on the features and then reacted with portions of the features exposed to the metal to form silicide regions on the exposed portions. Portions of the features that are not exposed, e.g., portions covered by a spacer, do not form a silicide region. In this manner, self-aligned silicides are selectively formed on the features without patterning or etching deposited silicide to define low resistively regions. Self-aligned suicides can be formed from metals that include nickel, titanium, cobalt, and other metals that can react with silicon materials to form silicides.

Figure 1A:
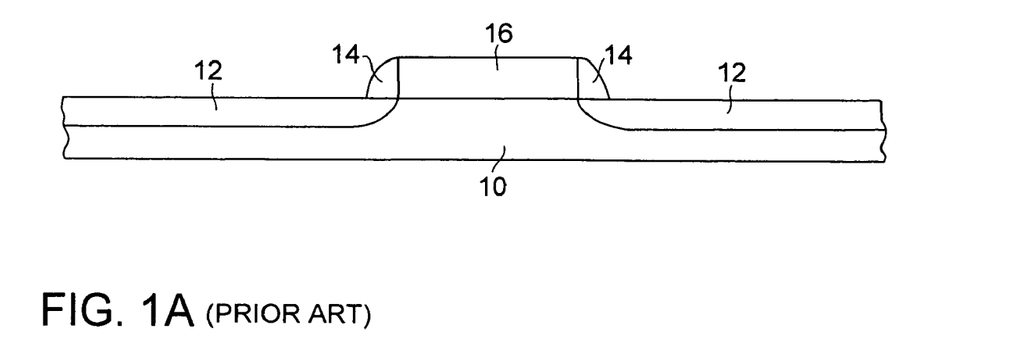
FIG. 1A-1C is a partial sectional side view of a substrate showing a one-step RTA salicide process.
Figure 1B:
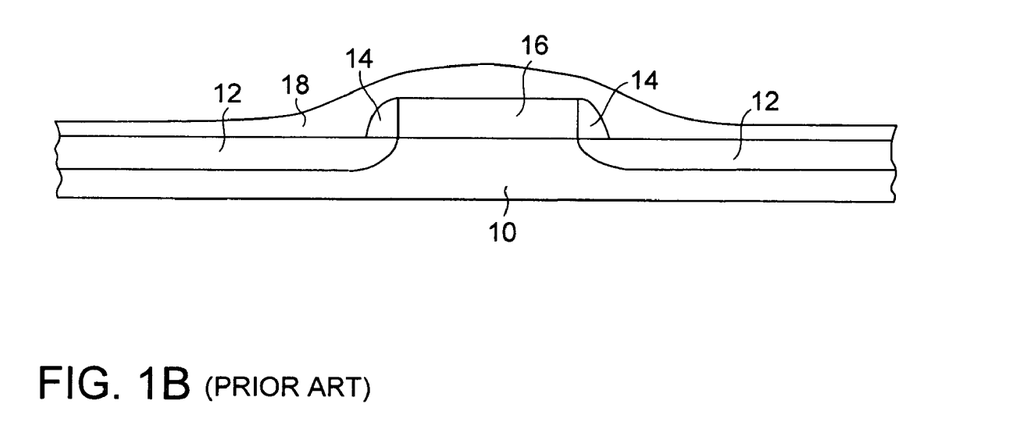
Figure 1C:
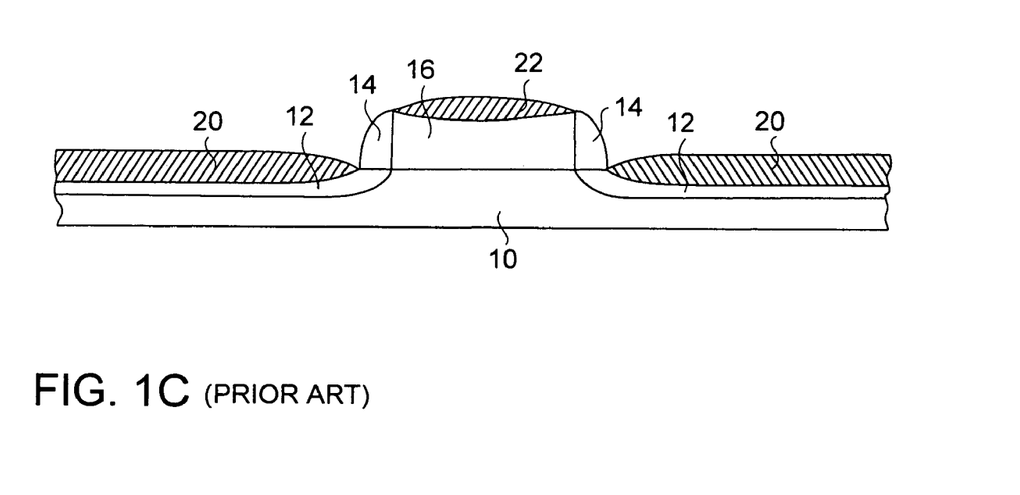

A conventional method of fabricating a self-aligned silicide structure known as a one-step rapid thermal anneal (RTA) process, is shown in FIGS. 1A-1C. FIG. 1A shows a silicon substrate 10 having silicon-containing features 16 that can be, for example, polycrystalline silicon. i.e., polysilicon, gate structures. The features 16 have adjacent spacers 14 that are typically a silicon oxide, silicon nitride, or other such ceramic material. The silicon substrate 10 has active regions 12 comprising doped silicon, that serve as a source and a drain of a transistor. In FIG. 1B, a layer of a silicide-forming metal or metal alloy 18 is deposited over the silicon-containing features 16. The multilayer structure of FIG. 1B then undergoes a rapid thermal anneal (RTA) process step at temperatures exceeding 500° C., causing the metal layer 18 to react with the exposed regions of the silicon-containing features 16. FIG. 1C shows the substrate 10 after the high temperature anneal step, where low resistivity metal silicide 20, 22 is formed over the active regions 12 and over the features 16, respectively.

Figure 2A:
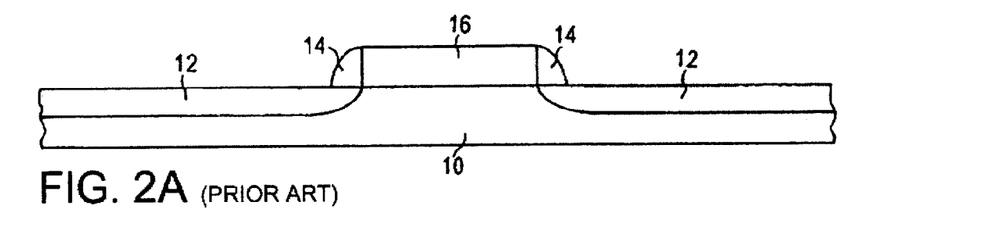
FIG. 2A-2D is a partial sectional side view of a substrate showing a two-step RTA salicide process.
Figure 2B:
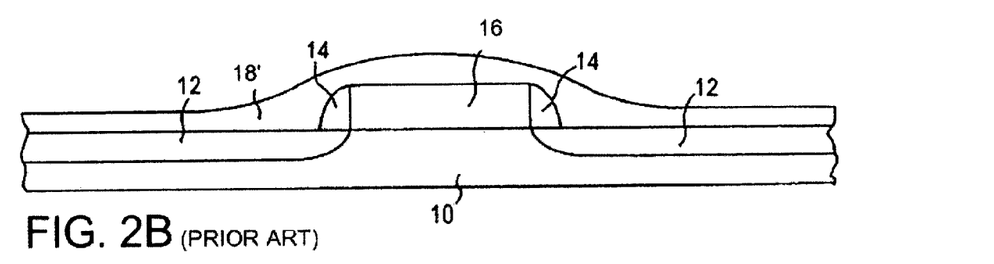
Figure 2C:
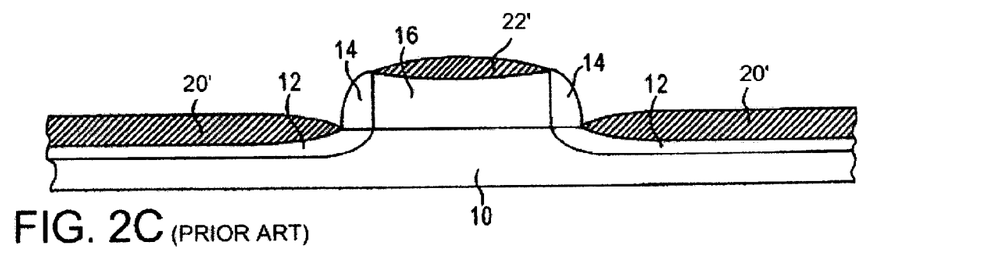
Figure 2D:
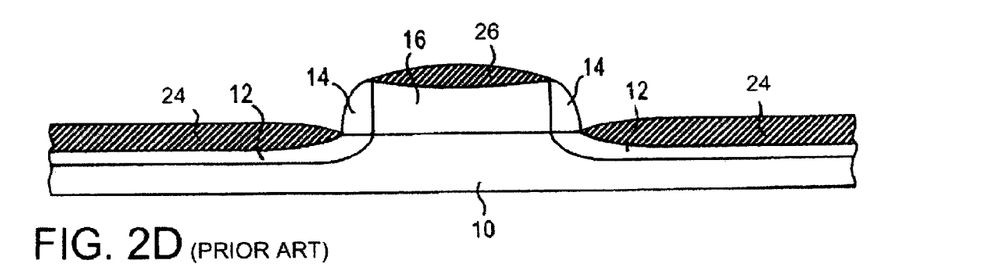

Another conventional process, known as a two-step RTA process, is shown in FIGS. 2A-2D. FIG. 2A shows the silicon substrate 10 having silicon-containing features 16 that have adjacent spacers 14. In FIG. 2B, the silicide-forming metal or metal alloy 18' is deposited at room temperature on the silicon-containing features 16, and then a first low temperature annealing process is conducted at temperatures of less than about 300° C. to form a high resistivity metal silicide layer 20', 22' over the active regions 12 and over the features 16, respectively (FIG. 2C). Unreacted metal on the silicon-containing features 16 or other dielectric layer is removed by wet etch. Then a second higher temperature annealing process is conducted at temperatures exceeding 450° C. to form the low resistivity metal silicide layer 24, 26 over the active regions 12 and over the features 16, respectively (FIG. 2D).

As semiconductor technology advances, it has become desirable for the dimensions of certain semiconductor features to become smaller. For example, it is desirable for a polycrystalline region and spacers to be formed as small as possible on a semiconductor substrate to enhance performance of semiconductor devices using this type of feature. For example, transistors adopting this general semiconductor feature are designed and implemented with such small dimensions to enable the transistor to execute computer instructions at faster speeds. The above described processes for forming a low resistivity metal silicide are not suitable for such small features.

Figure 3:
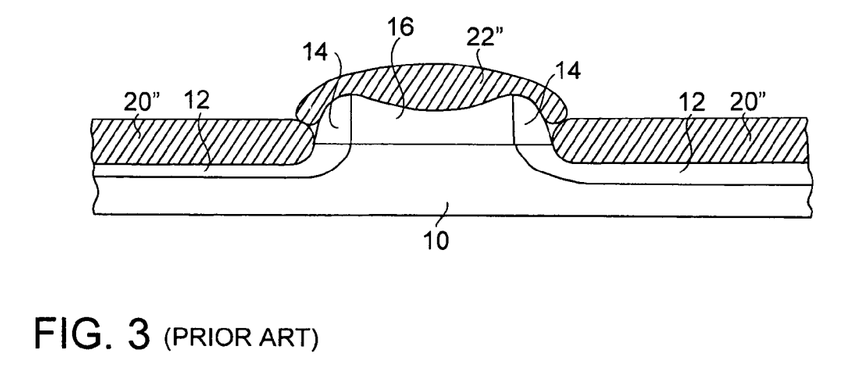
FIG. 3 is a partial sectional side view of a substrate showing bridging resulting from a one-step RTA process.
Figure 4:
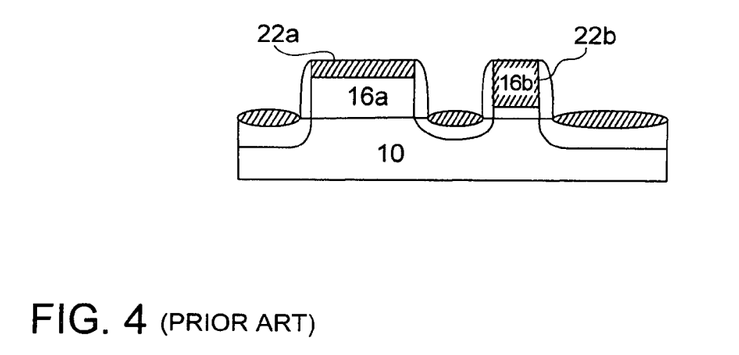
FIG. 4 is a partial sectional side view of a substrate showing excessive salicide formation.

For example, the one-step RTA process is particularly troublesome for certain silicide-forming metals, such as nickel. It has been observed that at the rapid thermal anneal temperatures ranging from 350° C. to 700° C. the reaction rate between the nickel and silicon is difficult to control resulting in the excessive formation of nickel silicide 20", 22" on the active regions 12 and features 16 that can lead to undesirable bridging. (FIG. 3.) Moreover, as is shown in FIG. 4, it has been observed that small (or short) features 16b tend to convert entirely or nearly entirely into nickel silicide 22b while larger (or taller) features 16a are partially converted. Conversion of the entire feature 16b to the metal silicide 22b is undesirable but inevitable given the difference in size between the larger feature 16a and the smaller feature 16b and given the uncontrollable reaction rates at the high anneal temperatures.

Figure 5:
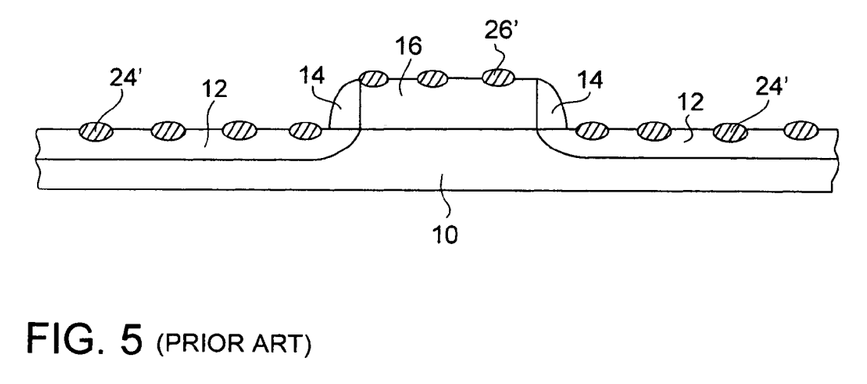
FIG. 5 is a partial sectional side view of a substrate showing the formation of titanium silicide clusters.

Moreover, particular metals present certain challenges. For example, the use of titanium in the two step RTA process to form titanium silicide in a self-aligned manner is not effective with semiconductor structures of smaller dimensions because titanium metal or titanium alloy does not fully react with the small surfaces of silicon materials such as the polycrystalline silicon region 16 and active regions 12 of FIG. 5. As is shown, the reaction mechanism between titanium and silicon is by nucleation, and therefore clusters 24', 26' of titanium silicide form. The clusters 24', 26' are scattered, and inconsistent, and do not adequately lower the resistivity of the silicon based components of the semiconductor structure. Hence, the use of titanium does not adequately serve the objectives of forming silicides in a self-aligned manner for relatively small semiconductor structures.

Cobalt can also be reacted with silicon containing features 16 to form self-aligned cobalt silicide regions in a semiconductor structure utilizing the two-step RTA process. Nevertheless, the temperatures at which the first and second RTAs are conducted are relatively high. For example, for cobalt, the first RTA is at temperatures ranging from 450° C. to 510° C. and the second RTA is at temperatures ranging from 760° C. to 840° C. These high temperatures can induce stress on the semiconductor structure and can destroy the functionality of the semiconductor device and limit the designs of the semiconductor structures utilizing self-aligned suicides. In addition, these relatively high temperatures may not be compatible or desirable with semiconductor processing of pre-existing components of the semiconductor structure. More particularly, these high temperatures may diffuse materials of the existing semiconductor structure.

A nickel silicide layer can also be formed utilizing the two-step RTA process, where a metal film comprising nickel is deposited at room temperature, the first RTA is at approximately 300° C. and the second RTA is at approximately 450° C. after wet etch of unreacted nickel. Nevertheless, the resultant nickel silicide layer exhibits poor thermal stability at high temperatures. e.g., ranging from about 700° C. to 800° C., due to agglomeration and/or $NiSi_2$ formation. Thus, such a nickel silicide layer becomes ineffective as a low resistivity layer eventually causing device failure.

Moreover, the one-step and two-step RTA processes are time-consuming and generally performed in at least two different chambers: one for depositing the metal film and another for performing the anneal(s). This increases the chances of contamination of the substrates during the transportation from one chamber to another the two-step RTA process is also slower and increases processing costs.

Accordingly, it is desirable to control the formation rate of the silicide to reduce silicide formation in and around the features. It is also desirable to form metal silicide regions that are thermally stable at high processing temperatures. It is further desirable to have a metal silicide process that can be performed in a single process chamber.

SUMMARY

In one version, a metal suicide layer can be formed on silicon-containing features of a substrate in a process chamber by placing the substrate in a process zone in the chamber, where the process zone is defined by a substrate support facing a metal sputtering target, a gas distributor and a gas exhaust. A metal film is sputter deposited on the substrate while at least a portion of the sputter deposited metal film is silicided by introducing a sputtering gas into the process zone, depositing sputtered metal from the metal sputtering target onto the substrate by energizing the sputtering gas by applying an electrical bias potential across the metal sputtering target and the substrate support, and siliciding a portion of the deposited sputtered metal by heating the substrate to a silicidation temperature exceeding about 200° C. to form a combined sputtered metal and metal silicide layer on the substrate. The remaining sputtered metal is silicided by maintaining the substrate at the silicidation temperature to form the metal silicide layer.

In another version, a nickel silicide layer is formed on features on a substrate by placing the substrate in a process zone to face a metal sputtering target comprising nickel. A portion of a deposited sputtered nickel layer on the substrate is silicided by heating the substrate to a silicidation temperature between about 200° C. and about 350° C. to form a combined sputtered nickel and nickel silicide layer on the substrate.

The instant method can also be used to form other metal silicide layers using a metal sputtering target comprising, for example, palladium, platinum, cobalt, or combinations thereof. For example, the target can comprise nickel and platinum, nickel, and palladium, or palladium and platinum.

In another version, a process chamber includes a substrate support for holding a substrate having silicon-containing features in a process zone, a metal sputtering target facing the substrate support, a temperature control system for heating the substrate support, and a controller. The controller includes program instructions for depositing sputtered metal from the metal sputtering target onto the substrate at a silicidation temperature exceeding about 200° C., and for maintaining the substrate at the silicidation temperature.

DRAWINGS

These features, aspects and advantages of the present invention will become better understood with regard to the following description, appended claims, and accompanying drawings, which illustrate examples of the invention. However, it is to be understood that each of the features can be used in the invention in general, not merely in the context of the particular drawings, and the invention includes any combination of these features, where:

DESCRIPTION

Figure 6:
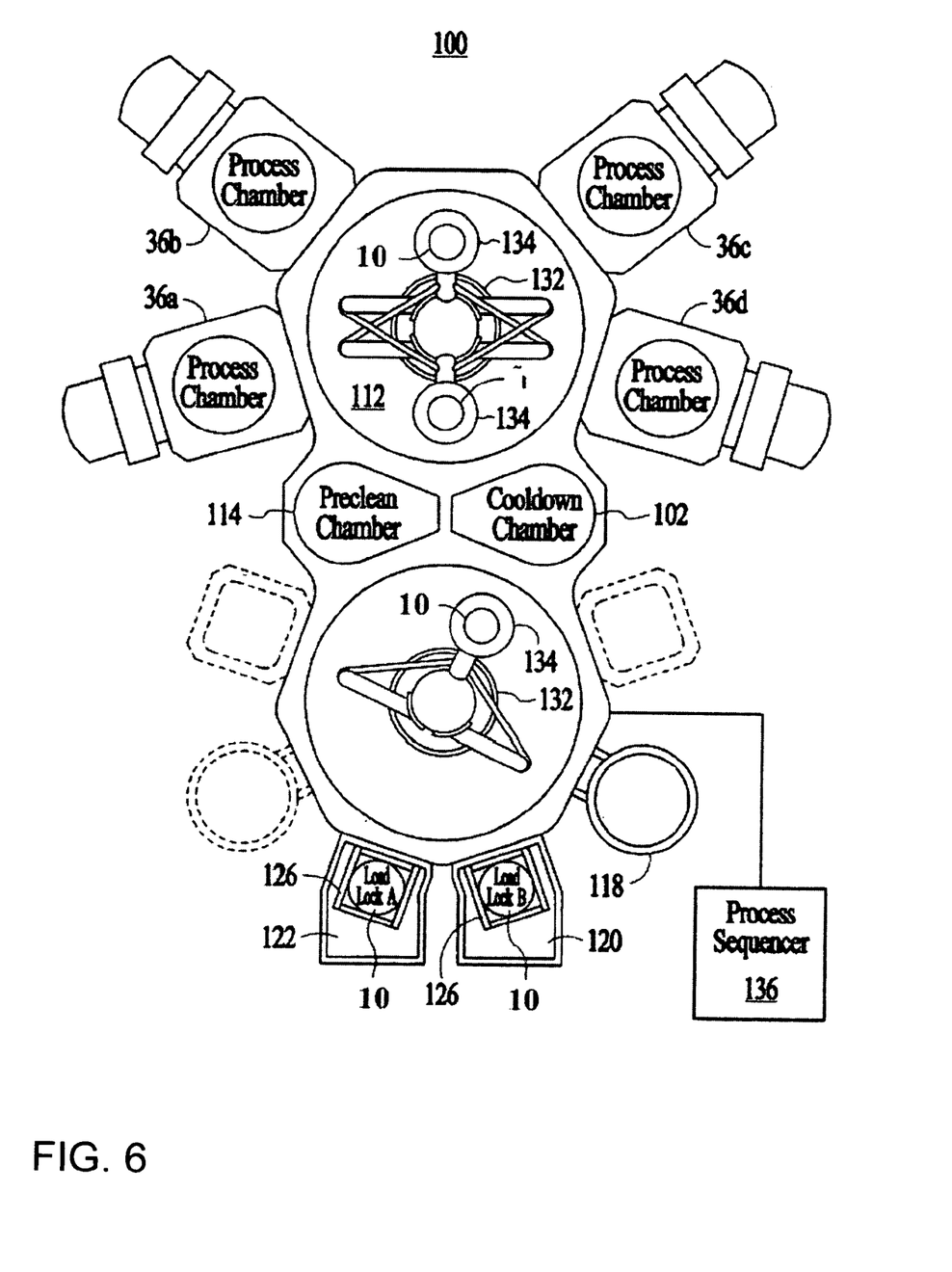
FIG. 6 is a schematic plan view of a version of a cluster tool system having multiple substrate processing chambers.

Embodiments of the present invention relate to a forming metal silicide layer on silicon-containing features of a substrate. The metal silicide layer is formed in a process chamber that may be part of a multi-chamber platform 100, as shown in FIG. 6. The multi-chamber platform 100 may be, for example, an "ENDURA" system commercially available from Applied Materials, Inc., of Santa Clara. Calif. The particular embodiment of the platform 100 shown herein, which is suitable for processing a planar silicon wafer substrate 10, is provided only to illustrate the invention, and should not be used to limit the scope of the invention.

The multi-chamber platform 100 typically comprises a cluster of interconnected chambers 36a-d, 114, 102, 118 and a substrate transport comprising robot arm mechanisms 132 to transfer substrates 10 between the chambers 36a-d, 114, 102, 118. The robot arm mechanisms 132 comprise robot arms having blades 134 that support and carry the substrates 10. Load-lock chambers 120, 122 receive transport cassettes 126 containing the substrates 10. A substrate orienting and degassing chamber 118 is provided to orient the substrate 10 in preparation for processing, and to degas the substrate 10 to remove contaminants from the substrate 10 that could otherwise disrupt the high-vacuum environment in the process chambers 36a-d. A pre-clean chamber 114 may be used to clean the substrates 10 prior to any deposition step, and a cool down chamber 102 may be used to cool the substrates 10.

A process sequencer 136 is provided to control the robot arm mechanisms 132, such as to order the sequence in which the robot arm mechanism 132 transfers the substrates 10 to and from the various chambers 36a-d, 114, 102, 118. Typically, the process sequencer 136 controls the robot arm mechanisms 132 to transfer a substrate 10 from one of the load lock chambers 120, 122 to the orienting and degassing chamber 118. then to the preclean chamber 114. then to one or more of the process chambers 36a-d. and afterwards to the cool down chamber 102.

Figure 7:
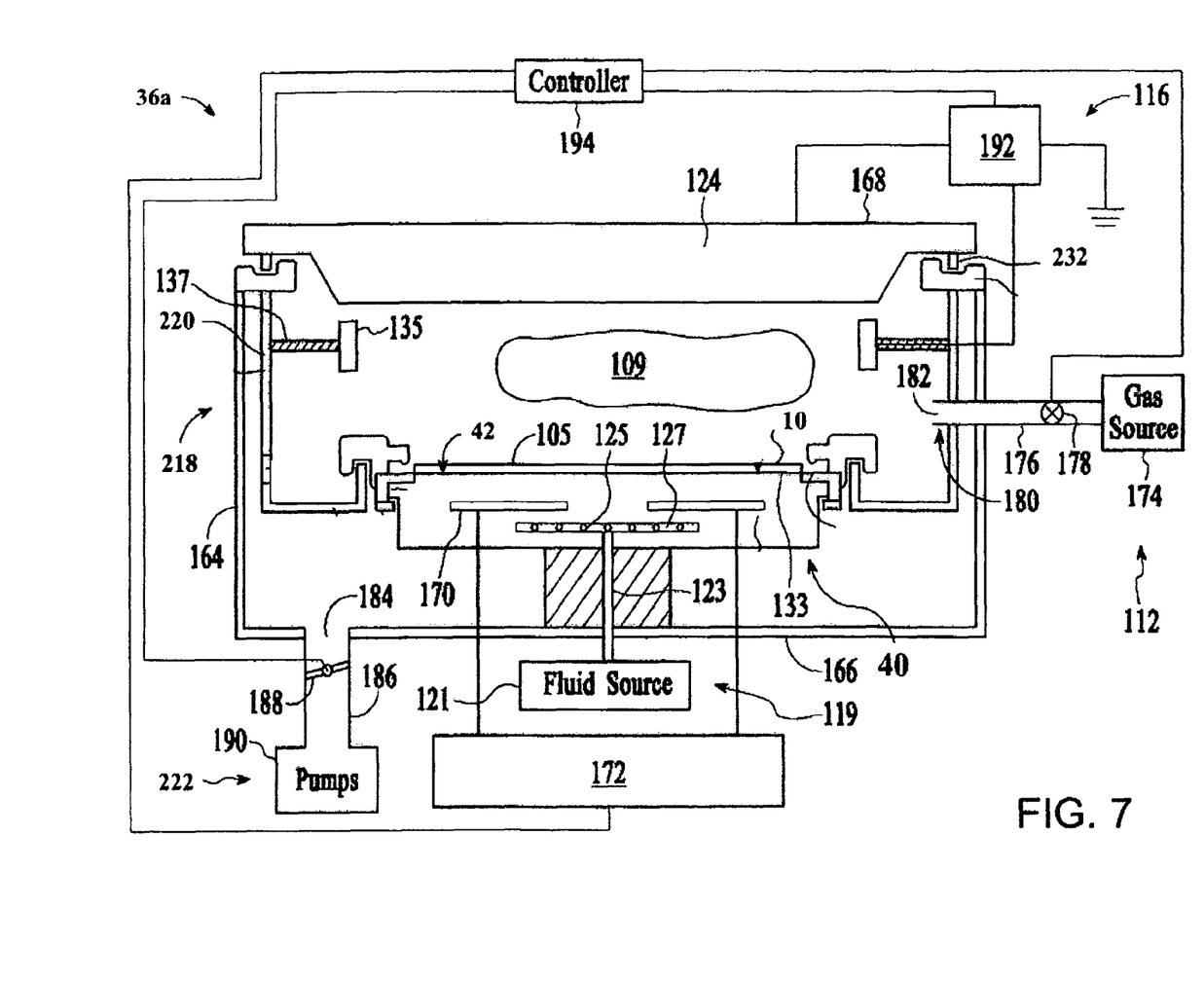
FIG. 7 is a schematic cross-sectional view of a version of a process chamber in which embodiments of the present invention may be performed.

The multi-chamber platform 100 has at least one physical vapor deposition (PVD) chamber 36a, as for example illustrated in FIG. 7. to sputter deposit the silicide-forming metal or metal alloy 18 on the substrate 10. The chamber 36a comprises enclosure walls 218 that enclose a process zone 109 and that include sidewalls 164, a bottom wall 166, and a ceiling 168. Other chamber walls can include one or more shields 220 that shield the enclosure walls 218 from the sputtering environment.

The chamber 36a comprises a substrate support 40 to support the substrate 10 in the sputter deposition chamber 36a. The substrate support 40 may be electrically floating or may comprise an electrode 170 that is biased by a power supply 172, such as an RF power supply. The substrate support 40 can also comprise a moveable shutter disk 133 that can protect the upper surface 42 of the support 40 when the substrate 10 is not present. In operation, the substrate 10 is introduced into the chamber 36a through a substrate loading inlet (not shown) in a sidewall 164 of the chamber 36a and placed on the support 40. The support 40 can be lifted or lowered by support lift bellows and a lift finger assembly (not shown) can be used to lift and lower the substrate 10 onto the support 40 during transport of the substrate 10 into and out of the chamber 36a.

The chamber 36a can further comprise a temperature control system 119 to control one or more temperatures in the chamber 38a, such as a temperature of the support 40. In one version, the temperature control system 119 comprises a fluid supply adapted to provide heat exchange fluid to the support 40 from a fluid source 121. One or more conduits 123 deliver the heat exchange fluid from the fluid source 121 to the support 40. The support 40 can comprise one or more channels 125 therein, such as for example channels 125 in a metal cooling plate 127 through which the heat exchange fluid is flowed to exchange heat with the support 40 and control the temperature of the support 40 for example by heating or cooling the support 40. A suitable heat exchange fluid may be, for example, water. Controlling the temperature of the support 40 can also provide good temperature of elements that are in good thermal contact with the support 40 such as for example a substrate 10 on the surface 42 of the support 40.

In one aspect to improve heat transfer between the substrate 10 and support 40 a substrate chuck (not shown) may be used. For example, a clamp ring may mechanically hold the substrate 10 against the support 40. In another example, an electrostatic chuck, such as an electrostatic ceramic chuck available from Applied Materials, Inc., of Santa Clara, Calif., may be used to electrically secure the substrate 10 to the support 40.

A process gas, such as a sputtering gas, is introduced into the chamber 36a through a gas delivery system 112 that includes a process gas supply comprising one or more gas sources 174 that each feed a conduit 176 having a gas flow control valve 178 such as a mass flow controller, to pass a set flow rate of the gas through. The conduits 176 can feed the gases to a mixing manifold (not shown) in which the gases are mixed to form a desired process gas composition. The mixing manifold feeds a gas distributor 180 having one or more gas outlets 182 in the chamber 36a.

The process gas may comprise a non-reactive gas, such as argon or xenon, which is capable of energetically impinging upon and sputtering material from a target. Spent process gas and byproducts are exhausted from the chamber 36a through an exhaust 222 which includes one or more exhaust ports 184 that receive spent process gas and pass the spent gas to an exhaust conduit 186 in which there is a throttle valve 188 to control the pressure of the gas in the chamber 36a. The exhaust conduit 186 feeds one or more exhaust pumps 190. Typically, the pressure of the sputtering gas in the chamber 36a is set to sub-atmospheric levels.

The sputtering chamber 36a further comprises a sputtering target 124 facing a surface 105 of the substrate 10, and comprising material to be sputtered onto the substrate 10, such as nickel, palladium, platinum, cobalt, or combinations thereof. The target 124 is electrically isolated from the chamber 36a by an annular insulator ring 232 and is connected to a power supply 192. The sputtering chamber 36a also has a shield 220 to protect a wall 218 of the chamber from sputtered material. In one version, one or more of the power supply 192 target 124 and shield 220 operate as a gas energizer 116 that is capable of energizing the sputtering gas to sputter material from the target 124. The power supply 192 applies a bias voltage to the target 124 with respect to the shield 220. The electric field generated in the chamber 36a from the applied voltage energizes the sputtering gas to form a plasma that energetically impinges upon and bombards the target 124 to sputter material off the target 124 and onto the substrate 10. The support 40 having the electrode 170 and support electrode power supply 172 may also operate as part of the gas energizer 116 by energizing and accelerating ionized material sputtered from the target 124 towards the substrate 10. Furthermore, a gas energizing coil 135 can be provided that is powered by a power supply 192 and that is positioned within the chamber 36a to provide enhanced energized gas characteristics, such as improved energized gas density. The gas energizing coil 135 can be supported by a coil support 137 that is attached to a shield 220 or other wall in the chamber 36a.

The chamber 36a can be controlled by a controller 194 that comprises program code having instruction sets to operate components of the chamber 36a to process substrates 10 in the chamber 36a. For example, the controller 194 can comprise a substrate positioning instruction set to operate one or more of the substrate support 40 and substrate transport to position a substrate 10 in the chamber 36a; a gas flow control instruction set to operate the flow control valves 178 to set a flow of sputtering gas to the chamber 36a; a gas pressure control instruction set to operate the exhaust throttle valve 188 to maintain a pressure in the chamber 36a; a gas energizer control instruction set to operate the gas energizer 116 to set a gas energizing power level; a temperature control instruction set to control a temperature control system 119 to control temperatures in the chamber 36a; and a process monitoring instruction set to monitor the process in the chamber 36a.

Figure 8A:
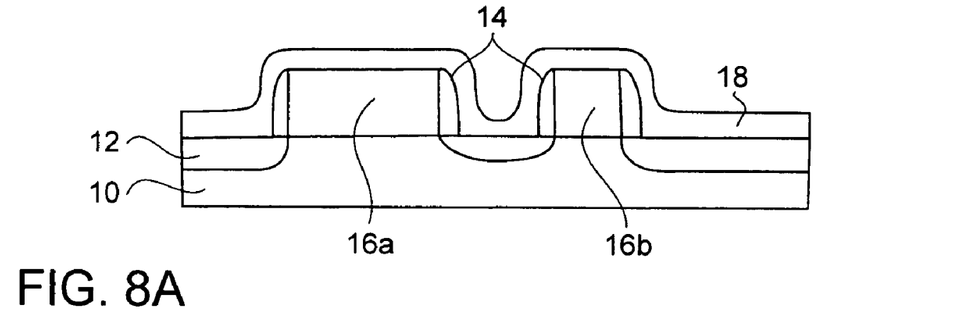
FIGS. 8A-8D are partial sectional side views of a substrate showing the silicide formation process according to a version of the present invention.
Figure 8B:
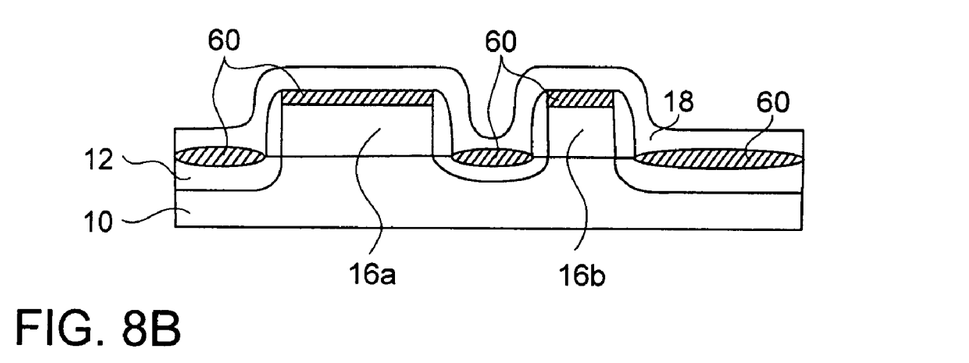
Figure 8C:
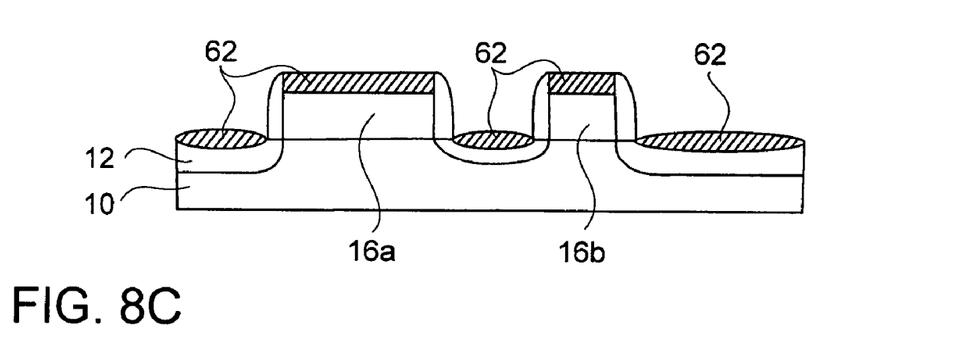

In one embodiment, a sputtering process is used to form a metal silicide layer on silicon-containing features on a substrate 10. FIGS. 8A-8D are schematic cross-sectional views of a substrate 10 having features 16a, 16b of varying dimensions and show the formation of the metal silicide layer thereon and FIG. 9 is a flowchart illustrating the silicide layer formation process according to a version of the present invention. The process begins by placing the substrate 10 in the process zone 109 of the chamber 36a (step 900) facing the target 124 that comprises the silicide-forming metal. The silicide-forming metal can comprise, for example, nickel, palladium, platinum, cobalt, or a combinations thereof, including mixtures of nickel and palladium or palladium and platinum. Silicides comprising nickel and palladium and/or palladium and platinum exhibit desirable characteristics such as low silicide formation temperatures, e.g., approximately about 200° C. for $Ni_2Si$; about 100° C. for $Pd_2Si$, and about 200° C. for $Pt_2Si$.

Next, the substrate 10 is heated to a silicidation temperature, Td (step 902). The silicidation temperature, Td, is within a range of temperatures at which a metal spontaneously forms a suicide with a silicon-containing material. For example, nickel, palladium and platinum form silicides at temperatures exceeding 200° C. and that cobalt forms a silicide at temperatures exceeding 350° C. Thus, at a low end of the temperature range, the silicidation temperature preferably exceeds the minimum temperature known to form a particular silicide. At a higher end of the temperature range, the silicidation temperature preferably is less than a temperature at which a silicide phase starts to be formed by a reaction controlled mechanism. For example, at about 750° C. for nickel, epitaxial nickel silicide, $NiSi_2$ is formed by the reaction controlled mechanism. For cobalt, $CoSi_2$ is formed by the reaction controlled mechanism at about 550° C., and for palladium, PdSi is formed by the reaction controlled mechanism at about 850° C. The silicide layer formed by the reaction controlled mechanism exhibits a rough interface and/or excessive silicon consumption, which leads to device failure.

Once the substrate 10 has been heated to the silicidation temperature, a sputtering gas is introduced to the process zone 109 and energized by applying an electrical bias potential across the sputtering target 124 and the ground electrode 170. The sputtering gas can be argon or xenon. For example, argon can be provided at a volumetric flow rate of from about 10 to about 150 sccm. The energized sputtering gas bombards the target 124 and a reactive metal film 18 is sputter deposited over the features 16a, 16b, spacers 14, and the active regions 12 (FIG. 8A). As shown in FIGS. 8A and 8B, the metal film 18 is deposited directly onto a silicon-containing feature 16a to form an interface at which the metal film 18 is in direct contact with the surface of the feature 16a. During the deposition process, the substrate 10 is maintained at the silicidation temperature.

The metal film 18 is preferably sputter deposited for a time period sufficient to deposit material in a thickness of from about 50 Angstroms to about 400 Angstroms, or preferably even from about 70 Angstroms to about 150 Angstroms. In one embodiment, during the deposition of the metal film 18, the power applied to the target 124 is typically in the range of from about 300 to about 1500 Watts, or from about 3000 to about 850 Watts, depending on the size and content of the target 124. For example, for a nickel target 124, the power applied is about 750 W with 70 sccm of Ar and 5 sccm of backside Ar flow, and for a NiPt target 124, the applied power is about 800 W with 18 sccm of Ar flow. The deposition time is from about 5 to 15 seconds. The operating pressure of the chamber 36a is from about 3 to about 5 mTorr, with a baseline chamber pressure of less than $3 \times 10^{-8}$ Torr.

As depicted in FIG. 8B, during the deposition process step, the temperature of the substrate is maintained sufficiently high to cause at least a portion of the metal film 18 to spontaneously react with the exposed surfaces of the silicon-containing features 16a, 16b and silicon-containing active regions 12 to form a combined metal film 18 and partial metal silicide layer 60 (step 904). Depending on the silicidation temperature, the partial metal silicide layer 60 can convert the entire metal film 18. i.e., if Td is at the high end of the temperature range, or it can convert a fraction of the metal film 18, i.e., if Td is at the low end of the temperature range.

After forming the combined metal 18 and partial metal silicide layer 60, the substrate 10 is maintained at the silicidation temperature for a period of time, referred to as a rest period. During this rest period, a remaining portion of the sputtered metal film 18 continues to react with the exposed silicon-containing regions 16a, 16b, 12 to form the metal silicide layer 62 (step 906) as depicted in FIG. 8C. The rest period can vary for different metal films 18, for different silicidation temperatures, and for different desired thicknesses.

For example, for a metal silicide layer 62 comprising nickel, platinum, palladium or combinations thereof, the rest period can range from about 1 seconds to about 180 seconds for a silicidation temperature between about 200° C. and about 350° C. resulting in a silicide film having a thickness of from about 200 Angstroms to about 400 Angstroms. For a metal silicide layer 62 comprising cobalt, the rest period can range from about 1 seconds to about 180 seconds for a silicidation temperature between about 350° C. and about 500° C., resulting in a silicide film having a thickness of from about 200 Angstroms to about 400 Angstroms.

After the rest period, the metal silicide layer 62 is formed and little if any residual metal film (not shown) remains. The amount of residual metal film depends on the initial thickness of the sputtered metal film 18 and on the desired thickness of the silicide layer 62. Any residual metal film can be removed in a wet etch (step 908). The wet etch step comprises removing the residual metal with HCl and $H_2O_2$ or $H_2SO_4$ and $H_2O_2$, in which the ratio of acids (HCl or $H_2SO_4$) to $H_2O_2$ is about 1:1 to about 1:4.

Figure 8D:
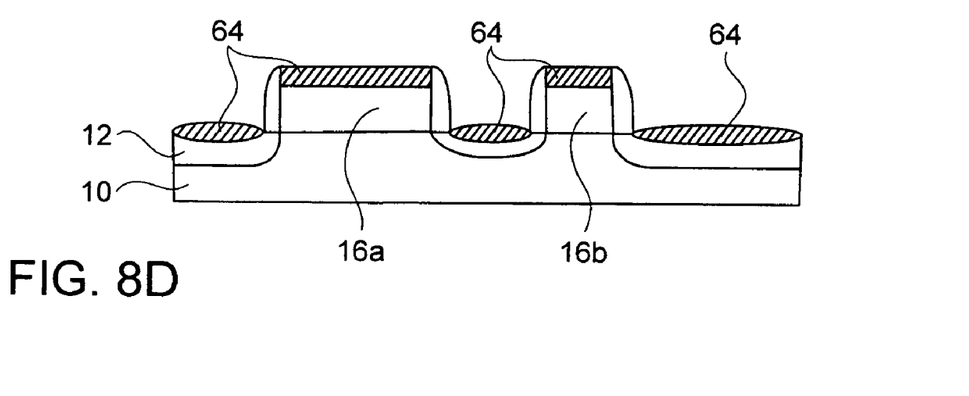
Figure 9:
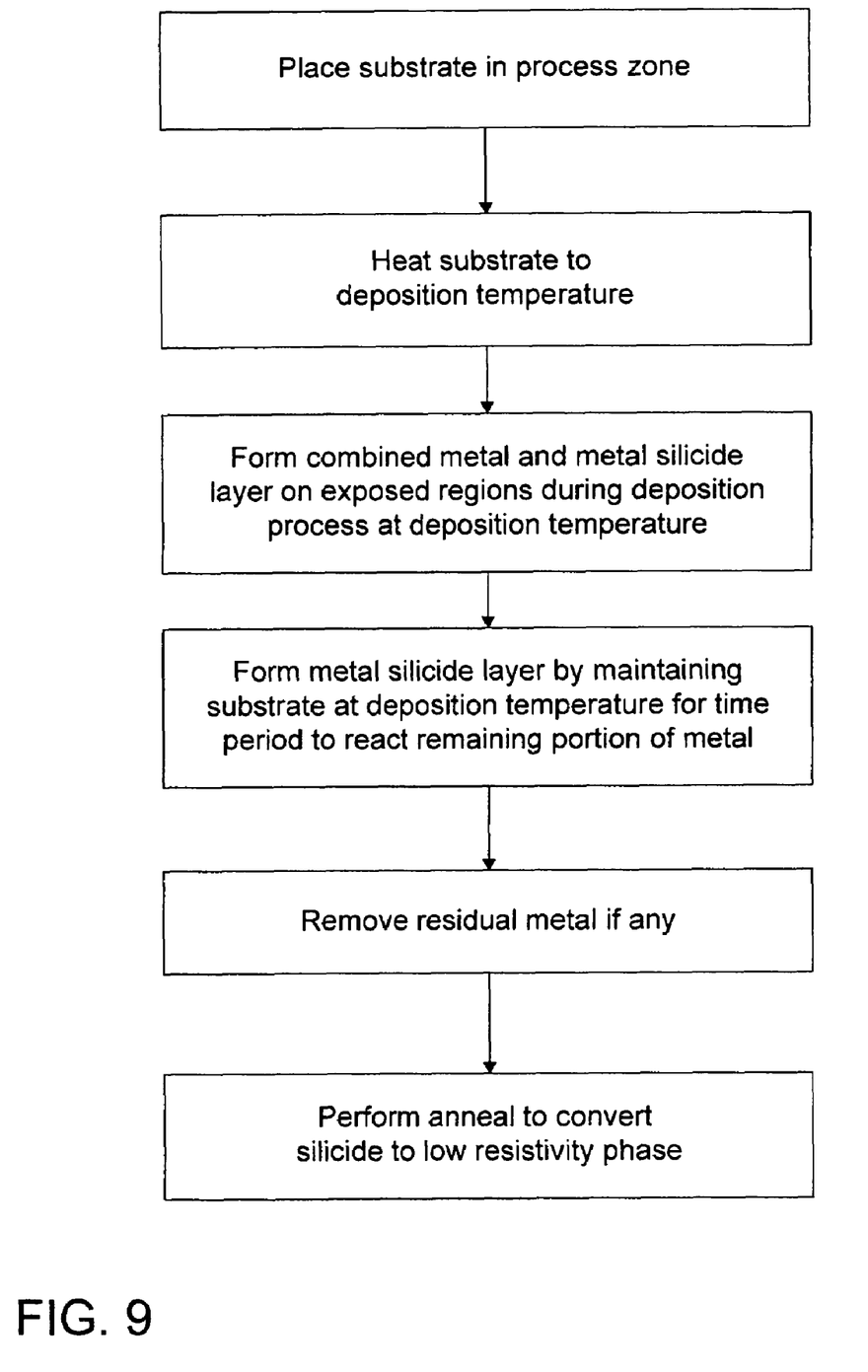
FIG. 9 is a flowchart illustrating the silicide formation process according to a version of the present invention.

Next, an anneal can be performed at a temperature sufficient to transform the metal suicide layer 62 to its low resistivity phase 64 (step 910), as is shown in FIG. 8D. The anneal can be a rapid thermal anneal at a temperature of at least about 450° C. for a time period of from about 10 to about 60 seconds. The annealing step can also be performed in a non-reactive gas environment, such as for example, a nitrogen or argon environment.

The resulting low resistivity metal silicide layer 64 exhibits qualities superior to those metal silicide layers produced by conventional techniques. For instance, for a nickel silicide layer 64 formed utilizing a version of the present invention, it has been observed that the low resistivity phase, i.e., NiSi, exhibits superior thermal stability characteristics compared to a nickel silicide layer formed utilizing conventional techniques. Scanning electron microscopy photographs show that a nickel silicide layer 64 deposited at a silicidation temperature of between about 250° C. and about 300° C. forms fewer agglomerates at temperatures exceeding 700° C. X-ray diffraction (XRD) results indicate that such a nickel silicide layer 64, i.e. deposited at a silicidation temperature of between about 250° C. and about 300° C. shows a preferential texture of (112) plane. It is suggested that the partial nickel silicide layer 60 formed during the deposition process acts as a seed layer for the nucleation of the preferential texture. Such a preferential texture stabilizes the interface between the nickel silicide layer 64 and silicon, resulting in a more thermally stable silicide at high temperatures.

From these observations, the silicidation temperature for nickel silicide formation, is preferably between about 250° C. and about 300° C. Because nickel, palladium and platinum share similar properties, the preferred silicidation temperature for palladium, platinum, and combinations of palladium, platinum and nickel silicides is between about 250° C. and about 300° C. For silicides comprising cobalt, the silicidation temperature is preferably between about 400° C. and about 450° C.

Utilizing embodiments of the present invention, excessive amounts of silicide 62 can be prevented from forming on the features 16a, 16b that can cause bridging (FIG. 3). Moreover, the thickness of the silicide layer 62 can be controlled to prevent excessive conversion of small dimensioned features 16b (FIG. 4). In addition, low resistivity metal silicide layers formed utilizing versions of the present invention exhibit superior thermal stability characteristics compared to those metal silicide layers formed utilizing conventional techniques. Finally, the entire silicide formation process can advantageously be performed in a single process chamber.

The present invention has been described with reference to certain preferred versions thereof: however, other versions are possible. For example, other silicide forming metals can be used aside from nickel, platinum, palladium and cobalt, as would be apparent to one of ordinary skill. Other configurations of the deposition chamber can also be used. Further, additional and/or alternative steps equivalent to those described for the silicide formation method can also be used in accordance with the parameters of the described implementation, as would be apparent to one of ordinary skill. For example, the annealing step can be preceded by a protective layer deposition step. Therefore, the spirit and scope of the appended claims should not be limited to the description of the preferred versions contained herein.

What is claimed is:

1. A method of forming a metal silicide layer on a substrate in a single process chamber, the process chamber comprising a process zone defined by a substrate support facing a metal sputtering target, a gas distributor, and a gas exhaust, the method comprising:

(a) placing the substrate on the substrate support in the process zone to face the metal sputtering target;
(b) sputter depositing a metal film on the substrate and siliciding substantially the entire sputter deposited metal film by:
  (i) heating the substrate to a silicidation temperature exceeding about 200° C.;
  (ii) introducing a sputtering gas into the process zone;
  (iii) depositing a sputtered metal film onto the heated substrate by energizing the sputtering gas by applying an electrical bias potential across the metal sputtering target and the substrate support,
  wherein at least a portion of the deposited sputtered metal film on the substrate forms a metal silicide layer on the substrate; and
  (iv) siliciding the remaining portion of the deposited sputtered metal film by maintaining the substrate at the silicidation temperature wherein step (b) is performed in the process zone of a single process chamber.

2. A method according to claim 1 wherein the substrate comprises silicon-containing features which include a first feature having a first thickness and a second feature having a second thickness.

3. A method according to claim 2 wherein (b)(iv) comprises:
  (i) forming a metal suicide layer on the first and second features that is less than 50% of the first thickness of the first feature and less than 50% of the second thickness of the second feature.

4. A method according to claim 1 wherein the metal sputtering target comprises nickel.

5. A method according to claim 4 wherein (b) (i) comprises heating the substrate to a silicidation temperature between about 200° C. and about 350° C.

6. A method according to claim 4 wherein (b) (iii) comprises depositing a sputtered metal film comprising nickel to a thickness of between about 50 Angstroms and about 400 Angstroms.

7. A method according to claim 4 wherein (b) (iv) includes maintaining the substrate at the silicidation temperature for a time period of between about 1 to about 180 seconds.

8. A method according to claim 1 wherein the metal sputtering target comprises cobalt.

9. A method according to claim 8 wherein (b) (i) comprises heating the substrate to a silicidation temperature of between about 350° C. and 500° C.

10. A method according to claim 8 wherein (b) (iv) includes maintaining the substrate at the silicidation temperature for a time period of between about 1 and about 180 seconds.

11. A method according to claim 1 wherein the metal sputtering target comprises one of palladium, platinum, a combination of nickel and platinum, a combination of palladium and nickel, and a combination of palladium and platinum.

12. A method according to claim 11 wherein (b) (i) comprises heating the substrate to a silicidation temperature of between about 200° C. and 350° C.

13. A method according to claim 11 wherein (b) (iv) includes maintaining the substrate at the silicidation temperature for a time period of between about 1 seconds and about 180 seconds.

14. A method according to claim 1 further comprising:
  (c) performing an anneal at a temperature sufficiently high to reduce a resistivity of the metal silicide layer.

15. A method of forming a metal suicide layer on a substrate in a process chamber, the process chamber comprising a process zone defined by a substrate support facing a metal sputtering target, a gas distributor, and a gas exhaust, the method comprising:

(a) placing the substrate on the substrate support in the process zone to face the metal sputtering target, the substrate comprising silicon-containing features;
(b) sputter depositing a metal film directly onto the silicon-containing features of the substrate and siliciding substantially the entire sputter deposited metal film by:
  (i) heating the substrate to a silicidation temperature exceeding about 200° C.;
  (ii) introducing a sputtering gas into the process zone;
  (iii) depositing a sputtered metal film from the metal sputtering target onto the heated substrate by energizing the sputtering gas by applying an electrical bias potential across the metal sputtering target and the substrate support, wherein at least a portion of the deposited sputtered metal film on the silicon-containing features of the substrate forms a metal silicide layer on the substrate; and
  (iv) siliciding the remaining portion of the deposited sputtered metal film by maintaining the substrate at the silicidation temperature,
wherein the step (b) is performed in the process zone of a single process chamber.

16. A method according to claim 15 wherein the silicon-containing features of the substrate include a first feature having a first thickness and a second feature having a second thickness.

17. A method according to claim 16 wherein (c) comprises:
  (i) forming a metal silicide layer on the first and second features that is less than 50% of the first thickness of the first feature and less than 50% of the second thickness of the second feature.

18. A method according to claim 15 wherein the metal sputtering target comprises nickel.

19. A method according to claim 18 wherein (b) (i) comprises heating the substrate to a silicidation temperature of between about 200° C. and about 350° C.

20. A method according to claim 18 wherein (b) (iii) further includes sputter depositing a metal film comprising nickel to a thickness of between about 50 Angstroms to about 400 Angstroms.

21. A method according to claim 18 wherein (b) (iv) includes maintaining the substrate at the silicidation temperature for a time period of between about 1 to about 180 seconds.

22. A method according to claim 15 wherein the metal sputtering target comprises cobalt.

23. A method according to claim 22 wherein (b) (i) comprises heating the substrate to a silicidation temperature of between about 350° C. and 500° C.

24. A method according to claim 22 wherein (b) (iv) includes maintaining the substrate at the silicidation temperature for a time period of between about 1 to about 180 seconds.

25. A method according to claim 15 wherein the metal sputtering target comprises one of palladium, platinum, a combination of nickel and platinum, a combination of palladium and nickel, and a combination of palladium and platinum.

26. A method according to claim 25 wherein (b) (i) comprises heating the substrate to a silicidation temperature of between about 200° C. and 350° C.

27. A method according to claim 26 wherein (b) (iv) includes maintaining the substrate at the silicidation temperature for a time period of between about 1 and about 180 seconds.

28. A method according to claim 15 further comprising:
  (c) performing an anneal at a temperature sufficiently high to reduce a resistivity of the metal silicide layer.

* * * * *